United States Patent
Pan

(10) Patent No.: US 11,164,649 B1
(45) Date of Patent: Nov. 2, 2021

(54) TEST METHOD FOR MEMORY DEVICE

(71) Applicant: Winbond Electronics Corp., Taichung (TW)

(72) Inventor: Tzi-Wen Pan, Taichung (TW)

(73) Assignee: Winbond Electronics Corp., Taichung (TW)

( * ) Notice: Subject to any disclaimer, the term of this patent is extended or adjusted under 35 U.S.C. 154(b) by 18 days.

(21) Appl. No.: 16/853,724

(22) Filed: Apr. 20, 2020

(51) Int. Cl.
*G11C 29/02* (2006.01)
*G11C 29/50* (2006.01)
*G11C 29/38* (2006.01)
*G11C 29/24* (2006.01)
*G11C 29/44* (2006.01)
G11C 29/00 (2006.01)

(52) U.S. Cl.
CPC ............ *G11C 29/027* (2013.01); *G11C 29/24* (2013.01); *G11C 29/38* (2013.01); *G11C 29/44* (2013.01); *G11C 29/50004* (2013.01); *G11C 29/787* (2013.01); *G11C 29/789* (2013.01)

(58) Field of Classification Search
CPC ....... G11C 29/027; G11C 29/44; G11C 29/24; G11C 29/70; G11C 29/787; G11C 29/789; G11C 29/38
See application file for complete search history.

(56) References Cited

U.S. PATENT DOCUMENTS

| | | | |
|---|---|---|---|
| 4,809,231 A | 2/1989 | Shannon et al. | |
| 5,206,583 A * | 4/1993 | Dawson | G11C 29/52 324/73.1 |
| 5,828,599 A * | 10/1998 | Herdt | G11C 29/12 365/185.08 |
| 6,426,910 B1 * | 7/2002 | Santin | G11C 29/70 365/225.7 |
| 6,553,556 B1 * | 4/2003 | Blodgett | G11C 29/02 365/230.03 |
| 7,076,699 B1 * | 7/2006 | Puri | G11C 17/165 714/710 |
| 2003/0009615 A1 | 1/2003 | Hsu et al. | |
| 2008/0065929 A1 * | 3/2008 | Nadeau-Dostie | G11C 29/4401 714/5.11 |
| 2010/0157703 A1 * | 6/2010 | Fischer | G11C 29/44 365/200 |

(Continued)

OTHER PUBLICATIONS

"Office Action of Taiwan Counterpart Application", dated Nov. 5, 2020, p. 1-p. 7.

*Primary Examiner* — Steve N Nguyen
(74) *Attorney, Agent, or Firm* — JCIPRNET

(57) ABSTRACT

A test method for a memory device including the following steps is provided. A redundancy function of the memory device is disable and a first data is written to a first memory array. The redundancy function of the memory device is enabled and a second data is written to a second memory array. The first data and the second data are complementary. A redundancy information is read from a non-volatile memory block according to a margin condition and the second memory array is read based on the redundancy information to obtain a first readout data. A first test result is generated by comparing the second data and the first readout data. The second memory array includes a part of memory cells of the first memory array and at least one redundancy memory cell.

10 Claims, 7 Drawing Sheets

(56) References Cited

U.S. PATENT DOCUMENTS

| | | | |
|---|---|---|---|
| 2012/0038410 A1* | 2/2012 | Liao | G11C 29/028 327/434 |
| 2016/0012917 A1* | 1/2016 | Kang | G11C 29/787 714/719 |
| 2018/0090221 A1* | 3/2018 | Kim | G11C 29/24 |

* cited by examiner

MA → 1 1 1 1 1 1 1 1 1 1 1 1
FIG. 4A
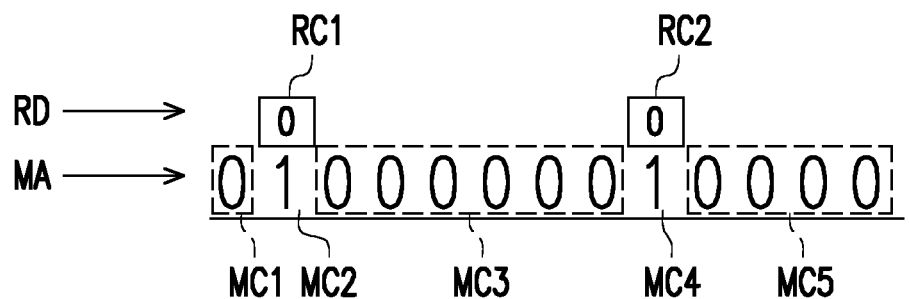
FIG. 4B
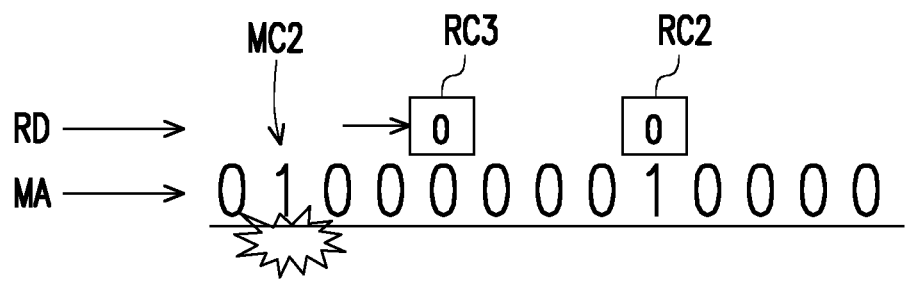
FIG. 4C

TEST METHOD FOR MEMORY DEVICE

BACKGROUND OF THE INVENTION

1. Field of the Invention

The invention relates to a test method for a memory device, in particular to a test method for a memory device of a dynamic random access memory.

2. Description of Related Art

In a dynamic random access memory device, a plurality of redundancy memory cells are usually arranged to replace main memory cells damaged in a manufacturing process in order to improve a yield in manufacture. Above redundancy information in a replaced state is usually stored by a one-time programmable memory, and this one-time programmable memory can be embedded in a memory device.

Test actions for the one-time programmable memory are usually performed by a supplier. The supplier will carry out various test actions such as a normal condition and a margin condition on the one-time programmable memory. However, aberrance may be generated due to a processing process when the one-time programmable memory is embedded in a memory device of a dynamic random access memory. In the prior art, when test actions for the memory device are performed, test actions of various conditions are not performed again on the one-time programmable memory, while redundancy information in the one-time programmable memory is read only by the normal condition. In this way, the fault coverage in the test actions for the memory device will be reduced.

SUMMARY OF THE INVENTION

The invention provides a test method for a memory device, which can effectively improve a fault coverage of a test.

The test method for the memory device of the invention includes the following steps. A redundancy function of the memory device is disabled and a first data is written to a first memory array. The redundancy function of the memory device is enabled and a second data is written to a second memory array. The first data and the second data are complementary. A redundancy information from a non-volatile memory block is read according to a margin condition and the second memory array is read to obtain a first readout data memory array based on the redundancy information. A first test result is generated by comparing the second data and the first readout data. The second memory array includes a part of memory cells of the first memory array and at least one redundancy memory cell.

Based on the foregoing, the invention makes the non-volatile memory block in the memory device respectively provide different redundancy information in a normal condition and the margin condition, and performs reading and writing actions for the memory arrays based on the different redundancy information, thereby detecting whether the non-volatile memory block can maintain normal operation in the margin condition or not. On the basis of a precondition of not significantly increasing test time of the memory device, the fault coverage of testing the memory device is improved, and reliability of the memory device is improved.

BRIEF DESCRIPTION OF THE DRAWINGS

FIG. 4A to FIG. 4C are schematic diagrams of implementations according to an embodiment of the invention.

DESCRIPTION OF THE EMBODIMENTS

Figure 1:
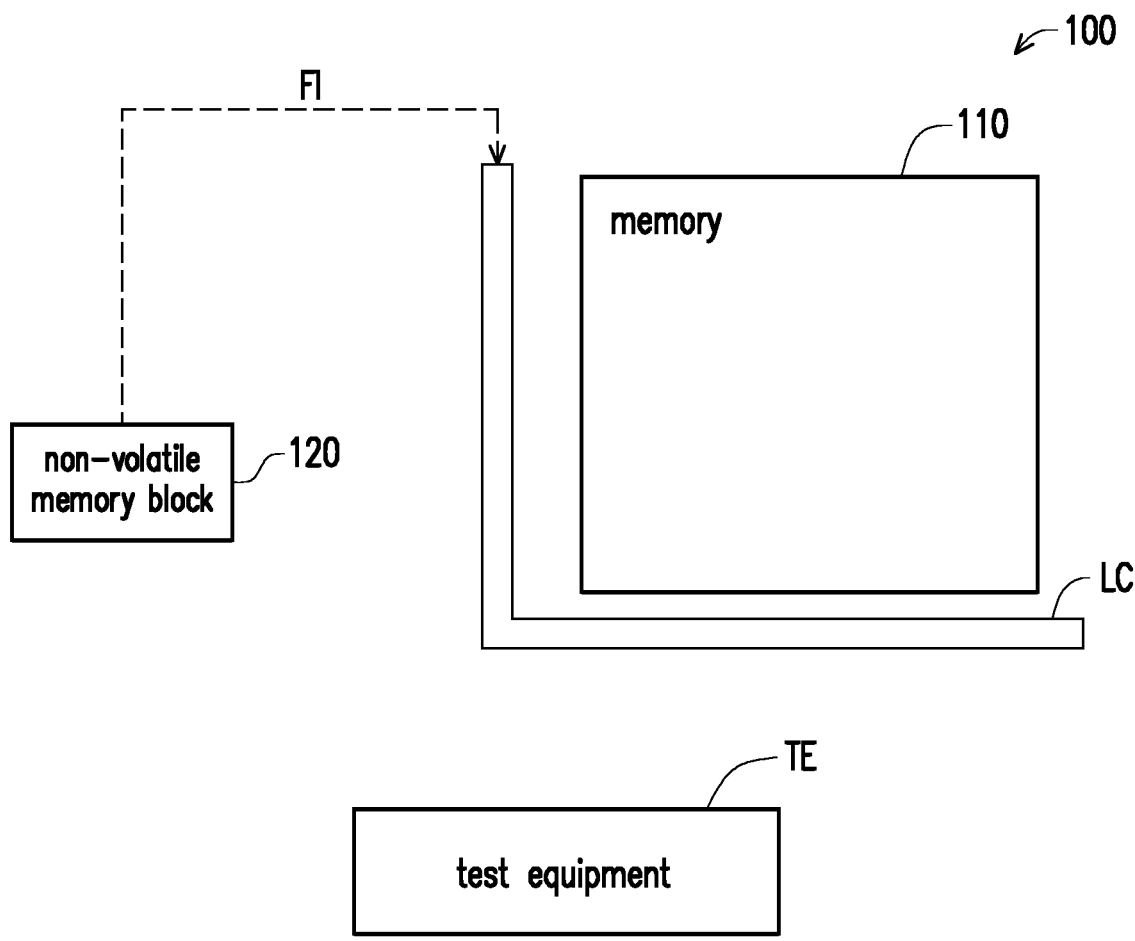
FIG. 1 is a schematic diagram of a memory device and test equipment according to an embodiment of the invention.

Referring to FIG. 1, FIG. 1 is a schematic diagram of a memory device and test equipment according to an embodiment of the invention. A memory device 100 includes a memory 110, a non-volatile memory block 120 and a register chain LC. The memory device 100 is coupled to test equipment TE, and the test equipment TE sends a command so as to perform test actions for the memory 110 and/or the non-volatile memory block 120. In the present embodiment, the memory 110, the non-volatile memory block 120 and the register chain LC may be arranged in the same integrated circuit. That is, the non-volatile memory block 120 may be embedded in the integrated circuit. The non-volatile memory block 120 may be an electronic fuse circuit or other one-time programmable memories. In addition, the memory 110 may be a dynamic random access memory. The test equipment TE may be a test machine outside the integrated circuit, or may be a circuit configured to perform a built-in self-test (BIST) and arranged in the integrated circuit.

In the present embodiment, the non-volatile memory block 120 can record a redundancy information FI. Part main memory cells in the memory 110 can be replaced with redundancy memory cells in the memory 110 when damaged, and normal operation of the memory device 100 is maintained. The redundancy information FI is configured to record an above redundancy state.

When performing the test actions, the test equipment TE may make the redundancy information FI in the non-volatile memory block 120 be read out, and make the redundancy information FI be loaded into the register chain LC. The register chain LC is constituted by a plurality of registers. Moreover, in a process of performing reading and writing test actions for the memory 110, when a redundancy function is enabled, the memory 110 may provide memory cells capable of working normally according to the redundancy information FI so as to perform the test actions.

Figure 2:
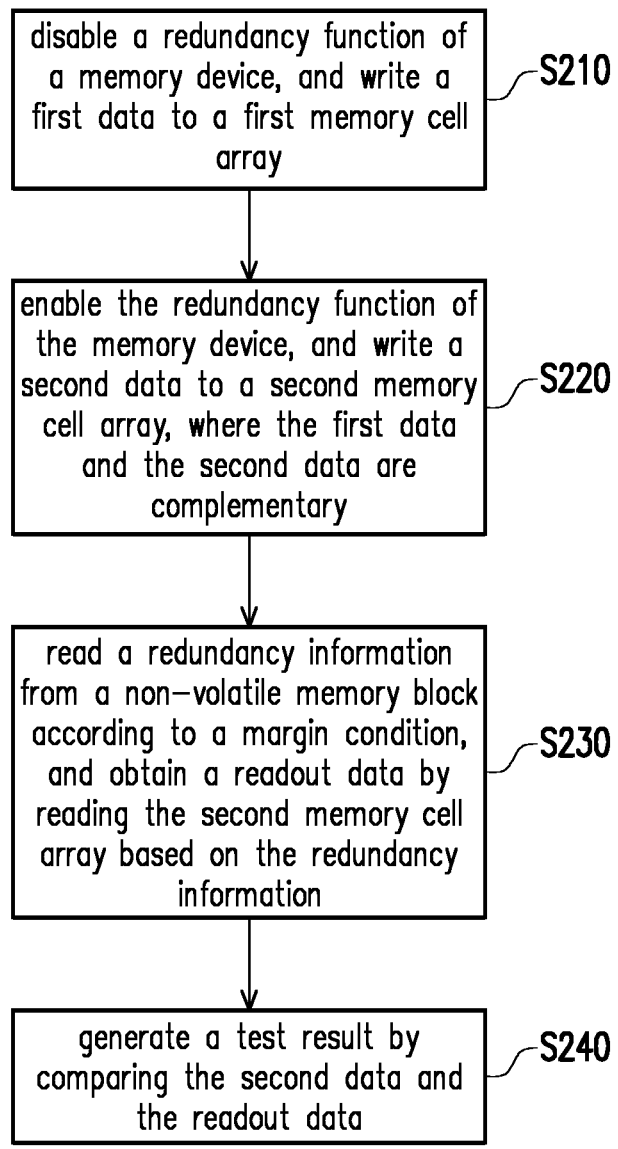
FIG. 2 is a flow diagram of memory test actions according to an embodiment of the invention.

With respect to a flow of the test actions, reference is made to a flow diagram of memory test actions according to an embodiment of the invention in FIG. 2. In step S210, a redundancy function of a memory device is disabled, and a first data is written to a first memory array. On the basis of the redundancy function in a disabled state, memory cells included in the first memory array are all main memory cells, and redundancy memory cells are not included herein.

Then, in step S220, the redundancy function of the memory device is enabled, and a second data is written to a second memory array. The first memory array and the second memory array are the same in logical address herein. On the basis of a precondition of enabling the redundancy function, the second memory array includes part memory cells of the first memory array and one or more redundancy memory cells. Moreover, the above first data and the above second data are in a complementary state. Taking a data of eight bits as an example, the first data may be 11111111, and the second data may be 00000000. Or, the first data may also be set to be 00000000, and the second data may be 11111111.

It is worth mentioning that in step S220, the redundancy function of the memory device is carried out according to a redundancy information read from a non-volatile memory block under a normal condition. That is, compositions of the memory cells in the second memory array correspond to the redundancy information of the normal condition.

In step S230, according to a margin condition, a reading action for the non-volatile memory block in the memory device is carried out, and the redundancy information of the non-volatile memory block is read out. Then, a readout data is obtained by reading the second memory array based on the redundancy information.

In step S240, a test result is generated by carrying out a comparison action for the second data and the readout data. It is noted herein that since the readout data is read out based on the redundancy information of the margin condition, if the redundancy information of the margin condition is correct, the redundancy information of the margin condition and the redundancy information of the normal condition will be the same, and the second data and the readout data should be the same. Relatively, if the redundancy information of the margin condition is wrong, the redundancy information of the margin condition and the redundancy information of the normal condition will be different, and the second data and the readout data should be different. Therefore, according to the comparison action for the second data and the readout data, whether the non-volatile memory block can still normally operate under the margin condition or not can be obtained so as to judge whether the memory device can be delivered out normally or not.

Figure 3:
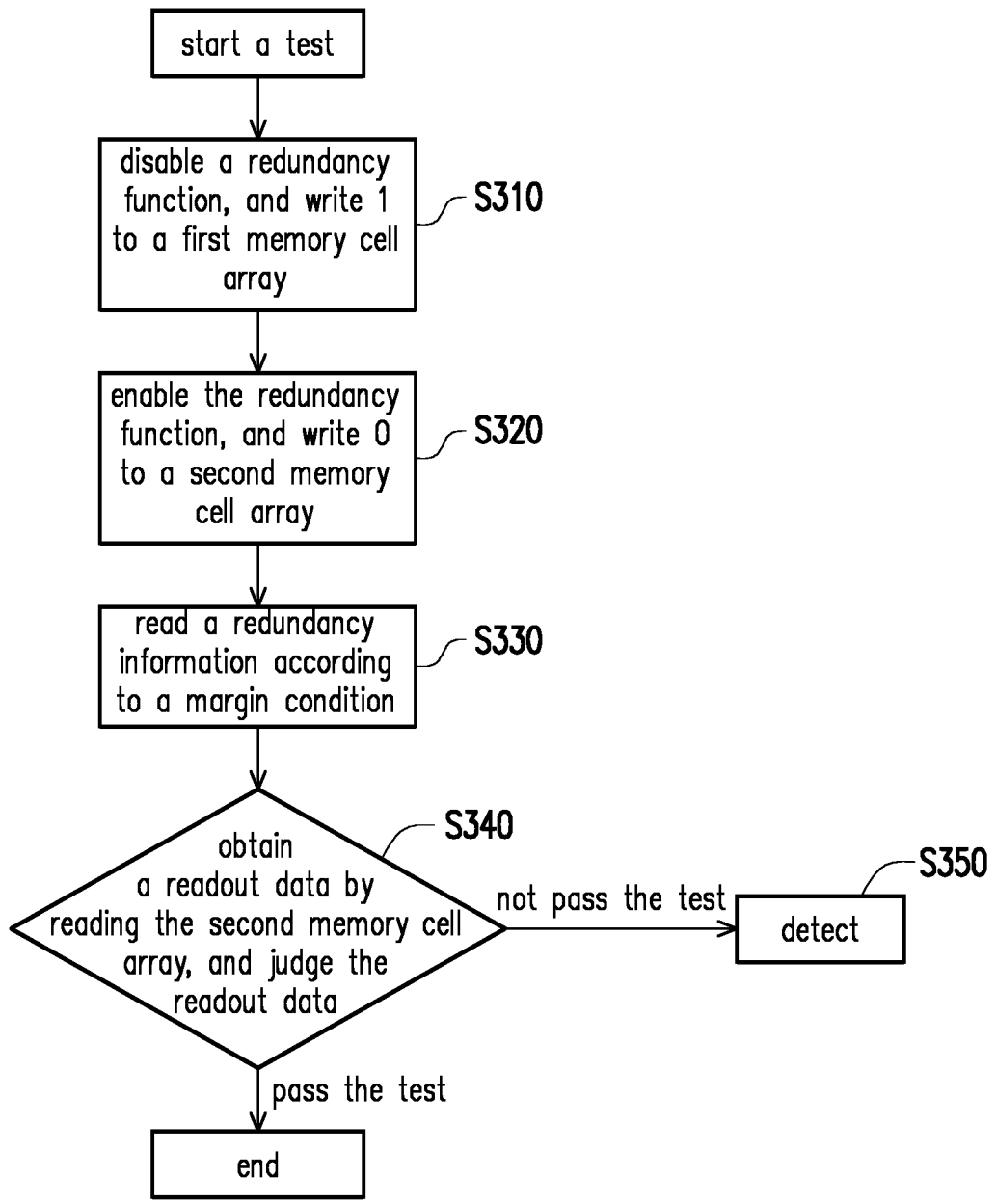
FIG. 3 is a flow diagram of test actions for a memory device according to a first embodiment of the invention.

Referring to FIG. 3, FIG. 3 is a flow diagram of test actions for a memory device according to a first embodiment of the invention. In step S310, a redundancy function of the memory device is disabled, and a writing action of a data 1 (a first data) is carried out on each bit of a first memory array. Then, on the basis of a redundancy information in a normal state, in step S320, a redundancy function is enabled, and a writing action of a data 0 (a second data) is carried out on each bit of a second memory array. The first memory array and the second memory array correspond to the same logical address herein. The second memory array includes part memory cells in the first memory array, and includes one or more redundancy memory cells.

In step S330, a redundancy information in a non-volatile memory block in the memory device is read according to a margin condition. In the first embodiment, a normal condition relative to the margin condition is obtaining a redundancy information by reading the non-volatile memory block according to a normal readout voltage. While under the margin condition, a margin readout voltage is generated by increasing or decreasing a normal readout voltage, and the redundancy information is obtained by reading the non-volatile memory block according to the margin readout voltage. That is, the redundancy information corresponding to the normal readout voltage and the redundancy information corresponding to the margin readout voltage may be the same or may be different.

In step S340, a readout data is obtained by reading the second memory array based on the redundancy information corresponding to the margin readout voltage. A test result may be generated by judging the readout data. If the readout data and the second data are the same, the non-volatile memory block can still provide a correct redundancy information under the margin condition, and the test result is that a test is passed. Relatively, if the readout data and the second data are different, the non-volatile memory block cannot provide the correct redundancy information under the margin condition, and the test result is that the test is not passed. A memory device passing the test can be delivered out normally, while a memory device not passing the test must be detected (step S350).

Referring to FIG. 4A to FIG. 4C, FIG. 4A to FIG. 4C are schematic diagrams of implementations according to an embodiment of the invention. Corresponding to the flow of FIG. 3, FIG. 4A corresponds to step S310, and the writing action of the data 1 is carried out on a first memory array MA under the situation of disabling the redundancy function. Moreover, FIG. 4B corresponds to step S320, and the writing action of the data 0 is carried out on a second memory array under the situation of enabling the redundancy function. At this time, the first memory array MA has memory cells MC2 and MC4 of two bits, which are judged to be damaged memory cells, and respectively replaced by redundancy memory cells RC1 and RC2 according to the redundancy information. Therefore, on the basis of a redundancy information of a normal condition, the second memory array includes part memory cells MC1, MC3 and MC5 of the first memory array MA, and the redundancy memory cells RC1 and RC2. Through the writing action in step S320, data in the memory cells MC1, MC3 and MC5 as well as the redundancy memory cells RC1 and RC2 are all written to be equal to the data 0.

FIG. 4C corresponds to steps S330 and S340, the redundancy information is read according to the margin condition, and the memory cells included in the second memory array may be changed when the redundancy information corresponding to the margin condition is wrong. The redundancy memory cell RC1 originally configured to replace the memory cell MC2 is not selected, and a selected redundancy memory cell RC3 is changed. The redundancy memory cell RC3 is not configured to replace the memory cell MC2. In this way, the readout data read from the second memory array will be changed to be 0100000000000, which is different from 0000000000000 written in step S320. Thus, it can be known that the redundancy information obtained under the margin condition is incorrect.

Figure 5:
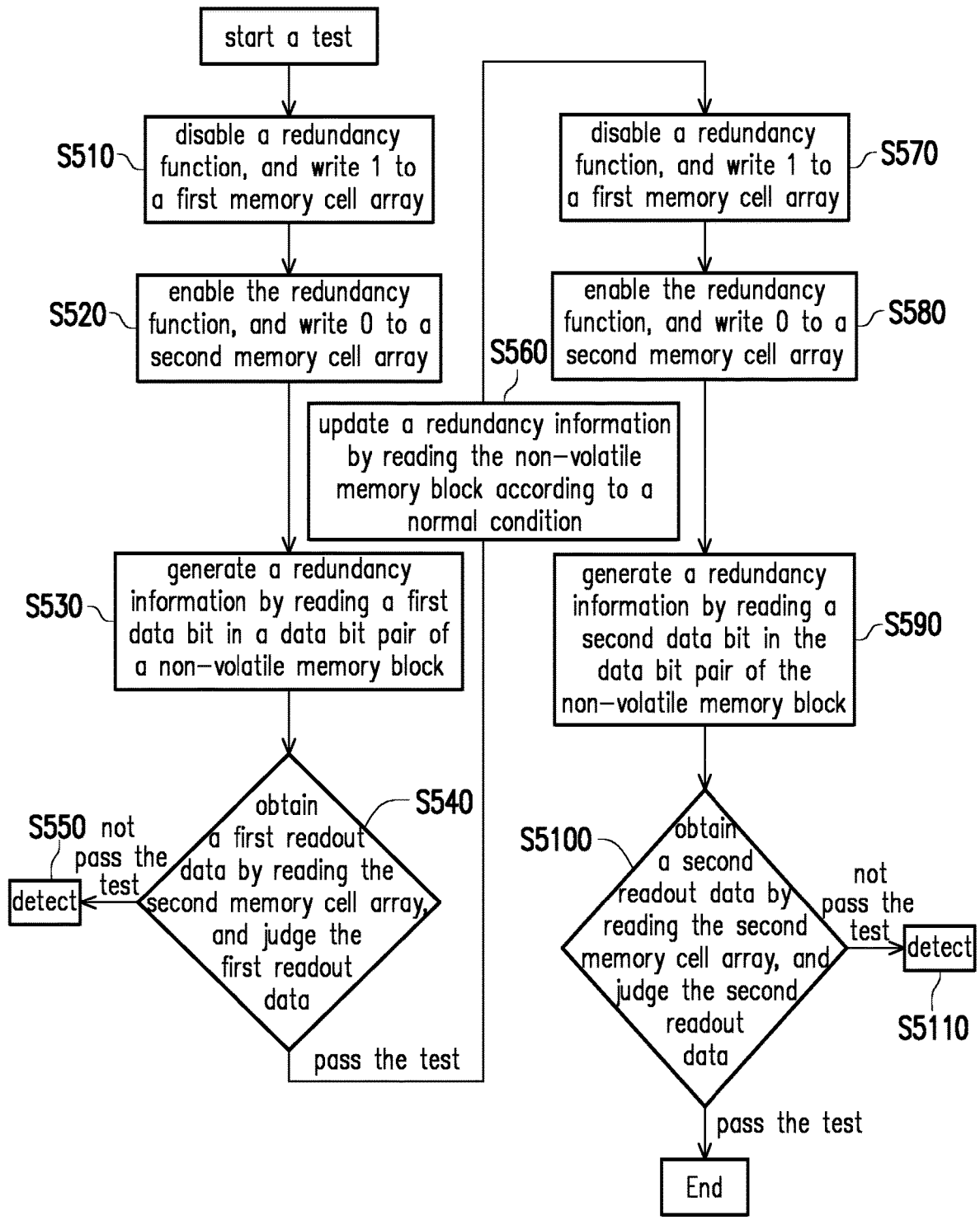
FIG. 5 is a flow diagram of test actions for a memory device according to a second embodiment of the invention.

Referring to FIG. 5, FIG. 5 is a flow diagram of test actions for a memory device according to a second embodiment of the invention. It is noted that in the present embodiment, a non-volatile memory block may provide a plurality of data bit pairs to respectively correspond to a plurality of redundancy information bits in a redundancy information. That is, the non-volatile memory block may provide two data bits for representation corresponding to one bit in the redundancy information. For example, a first bit corresponding to the redundancy information is a first data bit and a second data bit of the non-volatile memory block. When at least one of the first data bit and the second data bit is subjected to a programmed action, the first bit corresponding to the generated redundancy information is equivalent to be in a programmed state.

In the second embodiment of the invention, in step S510, a redundancy function is disabled, and a writing action of a data 1 (a first data) is carried out on a first memory array. In step S520, the redundancy function is enabled, and a writing action of a data 0 (a second data) is carried out on a second memory array. Then, in step S530, a first data bit in a data bit pair in the non-volatile memory block is read, and a redundancy information is generated according to the first data bit. It is noted herein that different from a general condition, in the present embodiment, one bit in the redundancy information is generated only according to a single bit in the data bit pair, which serves as a margin condition.

Then, in step S540, a first readout data is obtained by reading the second memory array, and a test result is obtained by judging the first readout data. The test result can be obtained by comparing the first readout data and the second data herein. When a test is not passed, step S550 is performed, and this memory device is detected. After the test is passed, step S560 is performed.

In step S560, the redundancy information is updated by reading the non-volatile memory block according to a normal condition (the single bit of the redundancy information is represented by one data bit pair in the non-volatile memory block). In step S570, the redundancy function is disabled again, and 1 is written to the first memory array. In step S580, the redundancy function is enabled, and 0 is written to the second memory array.

Then, in step S590, a redundancy information is generated again by reading a second data bit in the data bit pair of the non-volatile memory block. Based on the updated redundancy information, in step S5100, a second readout data is obtained by reading the second memory array, and a test result is generated by judging the second readout data. The test result can be obtained by comparing the second readout data and the second data herein. When a test is not passed, step S5110 is performed, and this memory device is detected. After the test is passed, the tested memory device can be delivered out.

Figure 6:
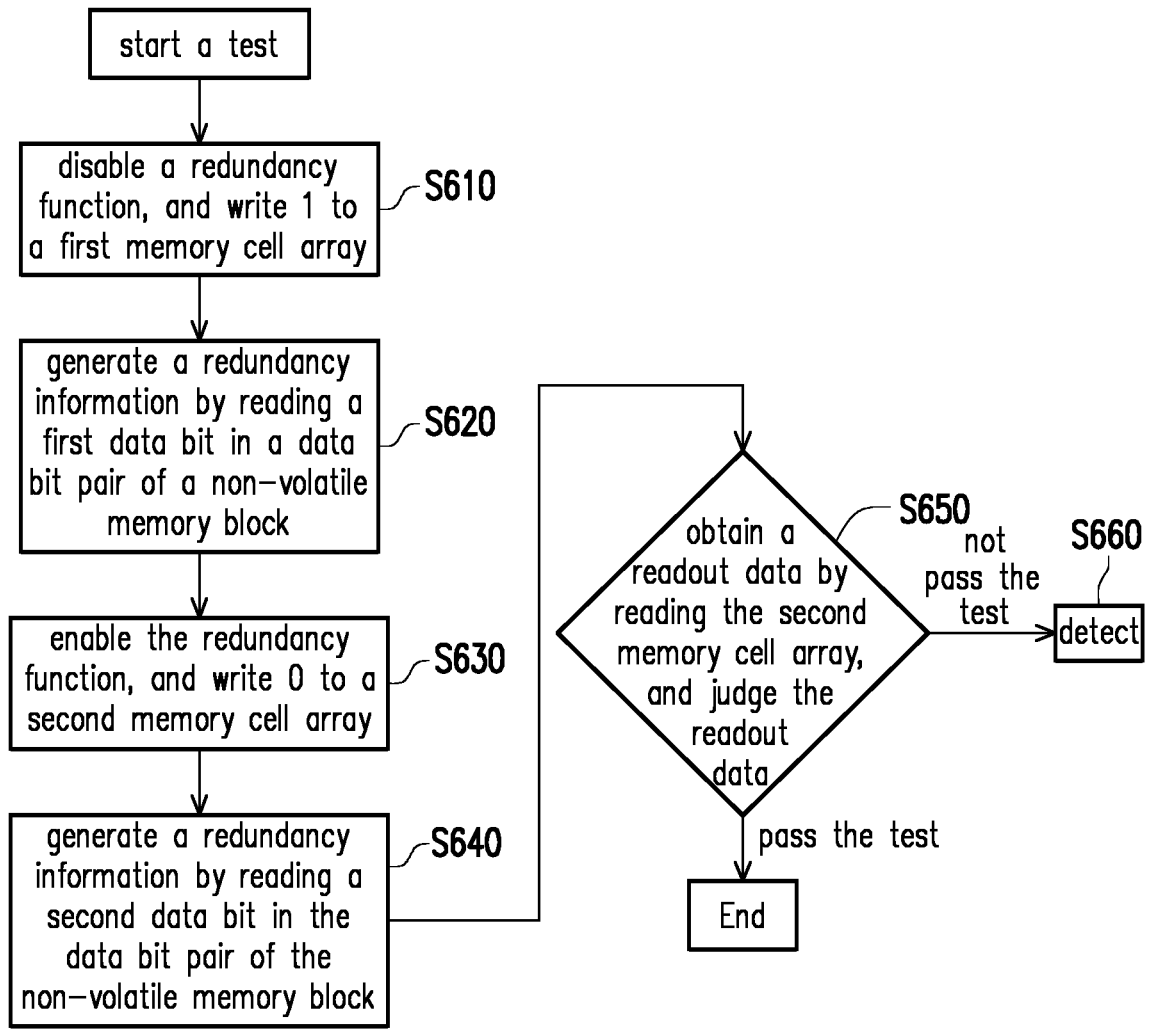
FIG. 6 is a flow diagram of test actions for a memory device according to a third embodiment of the invention.

Referring to FIG. 6, FIG. 6 is a flow diagram of test actions for a memory device according to a third embodiment of the invention. In step S610, a redundancy function is disabled, and a writing action of a data 1 (a first data) is carried out on a first memory array. In step S620, a redundancy information is generated by reading a first data bit in a data bit pair of a non-volatile memory block in the memory device. In step S630, the redundancy function is enabled, and 0 (a second data) is written to a second memory array. In step S640, a redundancy information is generated by reading a second data bit in the data bit pair of the non-volatile memory block. In step S650, a readout data is obtained by reading the second memory array, and a test result is generated by judging the readout data. If the readout data and the second data are the same, the redundancy information corresponding to the first data bit and the second data bit are the same, and thus the test result is that a test is passed, so that the memory device can be delivered out normally. Relatively, if the readout data and the second data are different, the redundancy information corresponding to the first data bit and the second data bit are different, and thus the test result is that the test is not passed, so that the memory device must be detected (step S660).

Figure 7:
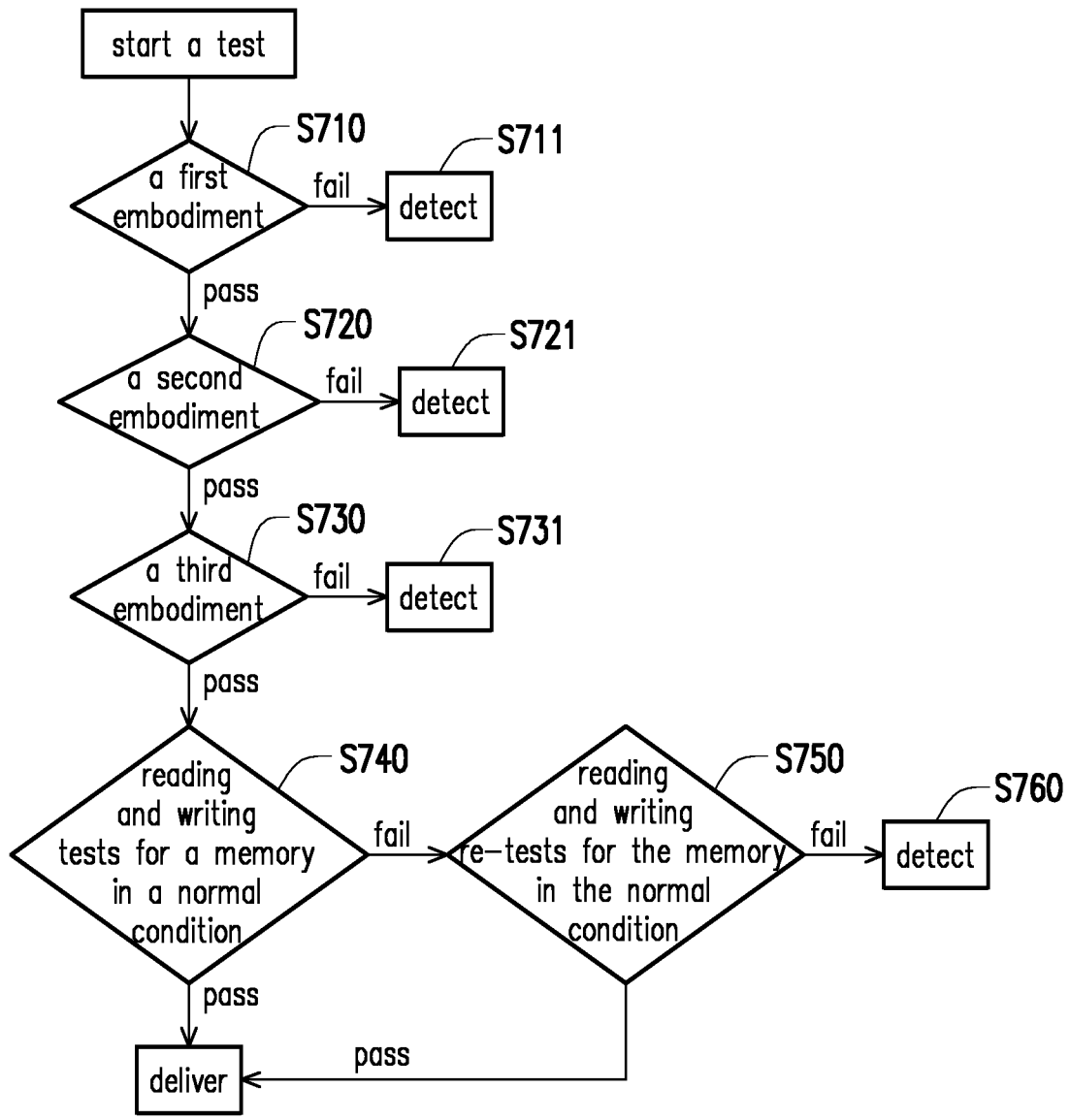
FIG. 7 is a flow diagram of complete test actions for a memory device according to an embodiment of the invention.

Referring to FIG. 7, FIG. 7 is a flow diagram of complete test actions for a memory device according to an embodiment of the invention. In the present embodiment, in order to enhance reliability of testing the memory device, the test flows of the above first embodiment, second embodiment and third embodiment can be performed in order in step S710 to step S730. Detection steps (steps S711, S721 and S731) of the memory device are performed under the situation that a test fails (is not passed) in one of step S710 to step S730.

When tests in step S710, step S720 and step S730 all pass, step S740 may be performed. A redundancy information is read according to a normal condition, and reading and writing tests for a memory are performed according to the redundancy information. Secondary reading and writing tests for the memory in step S750 may be performed if the reading and writing tests in step S740 fail. In the reading and writing tests for the memory in steps S740 and S750, if the test in one thereof passes, the tested memory device may be subjected to a delivery action, while if the reading and writing tests for the memory in steps S740 and S750 both fail, the tested memory device may be judged to be a defective product, and a detection step (step S760) is performed.

Based on the above, the invention carries out the writing action on the memory arrays according to the redundancy information of the normal condition, and then carries out the reading-out action on the memory arrays according to the redundancy information of the margin condition. Whether the non-volatile memory block can provide the correct redundancy information in the margin condition or not can be judged by comparing a written data and a readout data, and thus whether the memory device can act normally or not is tested. A fault coverage of testing the memory device is effectively improved under the condition of not significantly increasing test time.

What is claimed is:

1. A test method for a memory device, comprising:
   disabling a redundancy function of the memory device and writing a first data to a first memory array;
   enabling the redundancy function of the memory device and writing a second data to a second memory array, wherein the first data and the second data are complementary;
   reading a redundancy information from a non-volatile memory block according to a margin condition and reading the second memory array based on the redundancy information to obtain a first readout data; and
   generating a first test result by comparing the second data and the first readout data, wherein
   the second memory array comprises a part of memory cells of the first memory array and at least one redundancy memory cell.

2. The test method according to claim 1, wherein before the step of enabling the redundancy function of the memory device and writing the second data to the second memory array, the test method further comprises:
   reading the redundancy information from the non-volatile memory block according to a normal condition.

3. The test method according to claim 2, wherein the step of reading the redundancy information from the non-volatile memory block according to the normal condition comprises:
   obtaining the redundancy information by reading the non-volatile memory block according to a normal readout voltage.

4. The test method according to claim 3, wherein the step of reading the redundancy information from the non-volatile memory block according to the margin condition comprises:
   generating a margin readout voltage by increasing or decreasing the normal readout voltage and obtaining the redundancy information by reading the non-volatile memory block according to the margin readout voltage.

5. The test method according to claim 1, wherein the non-volatile memory block provides a plurality of data bit pairs to respectively correspond to a plurality of redundancy information bits in the redundancy information.

6. The test method according to claim 5, wherein the step of reading the redundancy information from the non-volatile memory block according to the margin condition and reading the second memory array based on the redundancy information to obtain the first readout data comprises:

reading a plurality of first data bits in the data bit pairs of the non-volatile memory block and respectively generating the redundancy information bits according to the first data bits.

7. The test method according to claim 6, wherein after the step of generating the first test result by comparing the second data and the first readout data, the test method further comprises:

reading the non-volatile memory block according to a normal condition to update the redundancy information.

8. The test method according to claim 7, further comprising:

disabling the redundancy function of the memory device again and writing the first data to the first memory array;

enabling the redundancy function of the memory device again and writing the second data to the second memory array;

reading a plurality of second data bits in the data bit pairs of the non-volatile memory block and respectively updating the redundancy information bits according to the second data bits;

reading the second memory array based on the updated redundancy information bits to obtain a second readout data; and generating a second test result by comparing the second data and the second readout data.

9. The test method according to claim 5, wherein before the step of writing the second data to the second memory array, the test method comprises:

reading a plurality of first data bits in the data bit pairs of the non-volatile memory block and respectively generating the redundancy information bits according to the first data bits.

10. The test method according to claim 9, wherein after the step of writing the second data to the second memory array, the method comprises:

reading a plurality of second data bits in the data bit pairs of the non-volatile memory block and respectively adjusting the redundancy information bits according to the second data bits.

\* \* \* \* \*